United States Patent
Hung et al.

(10) Patent No.: US 9,401,258 B2
(45) Date of Patent: Jul. 26, 2016

(54) FUSE STRUCTURE

(71) Applicant: TAIWAN SEMICONDUCTOR MANUFACTURING COMPANY, LTD., Hsinchu (TW)

(72) Inventors: Chen-Ming Hung, Zhubei (TW); Yun-Han Chen, Chiayi (TW); Shao-Tung Peng, Zhudong Township (TW); Shao-Yu Chou, Chu Pei (TW); Yue-Der Chih, Hsinchu (TW); Li-Chun Tien, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/446,789

(22) Filed: Jul. 30, 2014

(65) Prior Publication Data

US 2016/0035527 A1 Feb. 4, 2016

(51) Int. Cl.
*H01H 85/055* (2006.01)
(52) U.S. Cl.
CPC .................................. *H01H 85/055* (2013.01)

(58) Field of Classification Search
CPC .............................. H01L 23/525; H01L 29/00
See application file for complete search history.

(56) References Cited

U.S. PATENT DOCUMENTS

2008/0164969 A1* 7/2008 Kono ................... H01L 23/5256 337/416
2015/0340317 A1* 11/2015 Choi ................... H01L 23/5256 257/529

* cited by examiner

*Primary Examiner* — Mamadou Diallo
(74) *Attorney, Agent, or Firm* — Hauptman Ham, LLP

(57) ABSTRACT

A fuse structure comprises a first conductive layer on a first level. The first conductive layer comprises a fuse line extending in a first direction. The fuse line has a first end portion, a second end portion opposite the first end portion, and a fuse link portion connecting the first end portion and the second end portion. The first conductive layer also comprises lines parallel to the fuse line, the lines being aligned in the first direction and being separated from one another by a first distance measured in the first direction. The fuse structure also comprises a second conductive layer on a second level different from the first level and coupled with the first conductive layer. The second conductive layer has parallel lines extending in a second direction, the parallel lines being separated by a second distance measured in a third direction orthogonal to the second direction.

20 Claims, 4 Drawing Sheets

FUSE STRUCTURE

BACKGROUND

Some semiconductor devices include fuse structures. Some of the fuse structures included in such semiconductor devices are intentionally blown or otherwise caused to present an open circuit in order to configure the semiconductor device for a particular use. The blowing of one or more fuses in a semiconductor device to configure the semiconductor device is known as programming.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
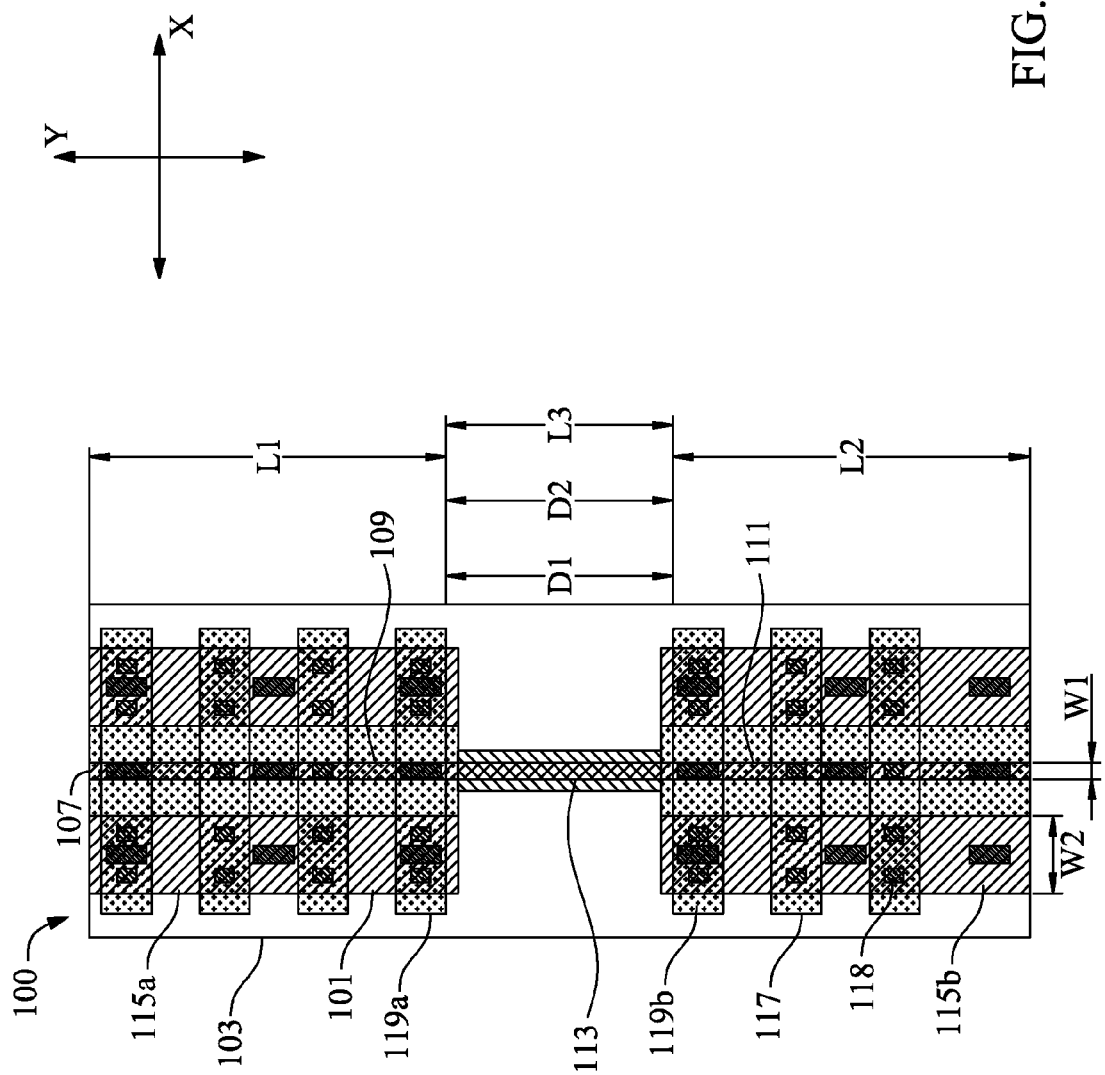
FIG. 1 is a plan-view of a fuse structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some semiconductor device fuse structures have a fuse line with an anode end and a cathode end. The fuse line has a fuse link connecting the anode end and the cathode end of the fuse line. Some semiconductor device fuse structures are manufactured in a metal layer over a substrate such that the anode end and the cathode end of the fuse line have line widths that are greater than a line width of the fuse link. The wider line widths of the anode end and the cathode end of the fuse line reduce the resistance of the fuse structure on the anode end and the cathode end of the fuse line. The reduced resistance results in an increased current under a uniform voltage. The reduced resistance improves the programmability of the fuse structure (i.e., the intentional blowing of the fuse structure).

Some one-dimensional (1-D) metal processes have design rule manuals (DRM's) that include 1-D metal process design rules that govern a direction that a metal layer or line within a metal layer is allowed to extend, a shape that a metal layer or line within a metal layer is allowed to take, and/or a dimensional range within which a metal layer or line within a metal layer is allowed to extend. For example, some 1-D metal process design rules dictate that a design rule compliant metal layer or line must be rectangular. Accordingly, some design rules for 1-D metal processes do not allow for wider line widths on the anode and the cathode ends of a fuse line compared to the fuse link line width. Rather, such 1-D metal process design rules often limit the line width on the anode end and the cathode end of the fuse line to a line width that is equal to the line width of the fuse link. Because a wider line width is not allowed to be formed on the anode end and the cathode end of the fuse line to reduce resistance, the fuse programmability of a fuse structure formed in compliance with such 1D-metal process design rules is reduced compared to a fuse structure that is formed via another manufacturing process that allows for line widths on the anode end and cathode end that are greater than the line width of the fuse link.

A fuse structure according to one or more embodiments has a wider line width of a fuse line on the anode end and the cathode end of the fuse line compared to that of the fuse link, while being in compliance with a 1-D metal process design rule that limits the line extension direction, dimensional range and/or shape of a metal layer or line.

FIG. 1 is a plan view of a fuse structure 100, in accordance with one or more embodiments. The fuse structure 100 comprises a first conductive layer 101 over a substrate 103. The substrate 103 comprises one or more of silicon, another suitable semiconductor material, glass, a polymer, or another suitable material. The first conductive layer 101 is on a first level over the substrate 103. The first conductive layer 101 comprises a fuse line 107 extending in a first direction Y. The fuse line 101 has a width W1. The fuse line 107 has a first end portion 109. The first end portion 109 has a length L1. In some embodiments, the first end portion 109 is an anode. The fuse line 107 also has a second end portion 111 opposite the first end portion 109. The second end portion 111 has a length L2. In some embodiments, the second end portion 111 is a cathode. The fuse line 107 additionally has a fuse link portion 113 connecting the first end portion 109 and the second end portion 111. The fuse link portion 113 has a length L3.

The first conductive layer 101 includes two sets of lines 115a and 115b that are parallel to the fuse line 107. Lines 115a are arranged in the first conductive layer 101 next to the first end portion 109 of the fuse line 107. Lines 115a are offset from one another and the fuse line 107 in a second direction X. Lines 115b are arranged in the first conductive layer 101 next to the second end portion 111 of the fuse line 107. Lines 115b are offset from one another and the fuse line 107 in the second direction X. Lines 115a and 115b extend along the first direction Y. Lines 115a and 115b are aligned in the first direction Y. Lines 115a and 115b are separated from one another by a distance D1 measured in the first direction Y such that lines 115a are closer to the first end portion 109 than lines 115b and lines 115b are closer to the second end portion 111 than lines 115a. In some embodiments, the distance D1 is equal to the length L3 of the fuse link portion 113. In some embodiments, the distance D1 is less than the length L3 of the fuse link portion 113. In other embodiments, the distance D1 is greater than the length of the fuse link portion 113. In some embodiments, the dimensional relationship between distance D1 and length L3 of the fuse link portion 113 is based on a design rule governing the manufacturability of the fuse structure 100.

Lines 115a and 115b have a width W2. In some embodiments, the width W2 is greater than the width W1 of the fuse link portion 113. In some embodiments, the width W2 is less than the width W1 of the fuse link portion 113. In other embodiments, the width W2 is equal to the width W1 of the fuse link portion 113. In some embodiments, the dimensional relationship between the width W1 of the fuse link portion 113 and the width W2 of the lines 115a and 115b is based on a design rule governing the manufacturability of the fuse structure 100. Though illustrated as having equal widths, in some embodiments, at least one line of the lines 115a and 115b has a width different from at least one other line of the lines 115a and 115b.

The fuse structure 100 includes a second conductive layer 117 over the substrate 103 on a second level different from the first level. In some embodiments, the first conductive layer 101 is over the second conductive layer 117. In other embodiments, the second conductive layer 117 is over the first conductive layer 101. The second conductive layer 117 is coupled with the first conductive layer 101 by couplings 118. In some embodiments, couplings 118 are one or more of vias, conductive lines, contact pads, or other suitable connecting structure or direct contact between the first conductive layer 101 and the second conductive layer 117.

The second conductive layer 117 includes two sets of parallel lines 119a and 119b extending in the second direction X. In some embodiments, the parallel lines 119a and 119b extend in a direction that is different from the first direction Y and the second direction X. The parallel lines 119a are positioned beneath the first end portion 109 of the fuse line 107 if the second conductive layer 117 is below the first conductive layer 101. The parallel lines 119a are positioned over the first end portion 109 of the fuse line 107 if the second conductive layer 117 is over the first conductive layer 101. The parallel lines 119b are positioned beneath the second end portion 111 of the fuse line 107 if the second conductive layer 117 is below the first conductive layer 101. The parallel lines 119b are positioned over the second end portion 111 of the fuse line 107 if the second conductive layer 117 is over the first conductive layer 101.

The parallel lines 119a and 119b are separated by at least a second distance D2. The second distance D2 is measured in a direction that is orthogonal to the direction that the parallel lines 119a and 119b extend. For example, if the parallel lines 119a and 119b extend in the second direction X, then the second distance D2 is measured in the Y direction, which is orthogonal to the second direction X. In some embodiments, the distance D2 is equal to the length L3 of the fuse link portion 113. In some embodiments, the distance D2 is less than the length L3 of the fuse link portion 113. In other embodiments, the distance D2 is greater than the length of the fuse link portion 113. In some embodiments, the dimensional relationship between distance D2 and length L3 of the fuse link portion 113 is based on a design rule governing the manufacturability of the fuse structure 100.

Lines 115a have a first quantity of lines. Lines 115b have a second quantity of lines equal to the first quantity of lines. Parallel lines 119a have a third quantity of lines. Parallel lines 119b have a fourth quantity of lines equal to the third quantity of lines. In fuse structure 100, the first quantity of lines and the second quantity of lines is less than the third quantity of lines and the fourth quantity of lines. In some embodiments, the first quantity of lines and the second quantity of lines are equal to the third quantity of lines and the fourth quantity of lines. In other embodiments, the first quantity of lines and the second quantity of lines are greater than the third quantity of lines and the fourth quantity of lines.

The coupling of the lines 115a with the lines 119a via couplings 118 effectively widens the first end portion 109 of the fuse line 107 reducing the resistance of the fuse line 107 on the first end portion 109 of the fuse line 107. Similarly, the coupling of the lines 115b with the lines 119b via couplings 118 effectively widens the second end portion 111 of the fuse line 107 reducing the resistance of the fuse line 107 on the second end portion 111 of the fuse line 107. Accordingly, the overall electrical resistance of the fuse line 107, and the fuse structure 100 as a whole, is reduced.

Some embodiments of the fuse structure 100, when compared to other fuse structures formed in compliance with a 1D-metal design rule, experienced a reduction of the overall fuse structure resistance by about 12%, which increased programming current by about 4%. Some embodiments of the fuse structure 100, when compared to other fuse structures formed in compliance with a 1D-metal design rule, experienced a reduction of the overall fuse structure resistance greater than about 12%, which increased programming current by more than about 4%. Other embodiments of the fuse structure, when compared to other fuse structures formed in compliance with a 1D-metal design rule, experienced a reduction of the overall fuse structure resistance by less than about 12%, which increased programming current by less than about 4%. The degree by which overall fuse structure resistance is, in some embodiments, dependent on the arrangement, quantity, length, width, and/or thickness of the lines 115a, 115b, 119a, 119b and couplings 118.

The second conductive layer 117 comprises a metal such as copper, gold, aluminum, nickel, titanium, other suitable conductive material, or combination thereof. In some embodiments, the first conductive layer 101 and the second conductive layer 117 comprise the same conductive material or combination of materials. In other embodiments, the first conductive layer 101 and the second conductive layer 117 comprise different conductive materials or combination of materials. In some embodiments, the types of materials used to form the first conductive layer 101 and the second conductive layer 117 are used based on a design rule governing the manufacturability of the fuse structure 100.

The first conductive layer 101 is formed by one or more of a physical vapor deposition process, a chemical vapor deposition process, a plating process, or another suitable process of forming a conductive layer over a substrate. The second conductive layer 117 is formed by one or more of a physical vapor deposition process, a chemical vapor deposition process, a plating process, or another suitable process of forming a conductive layer over a substrate.

Figure 2:
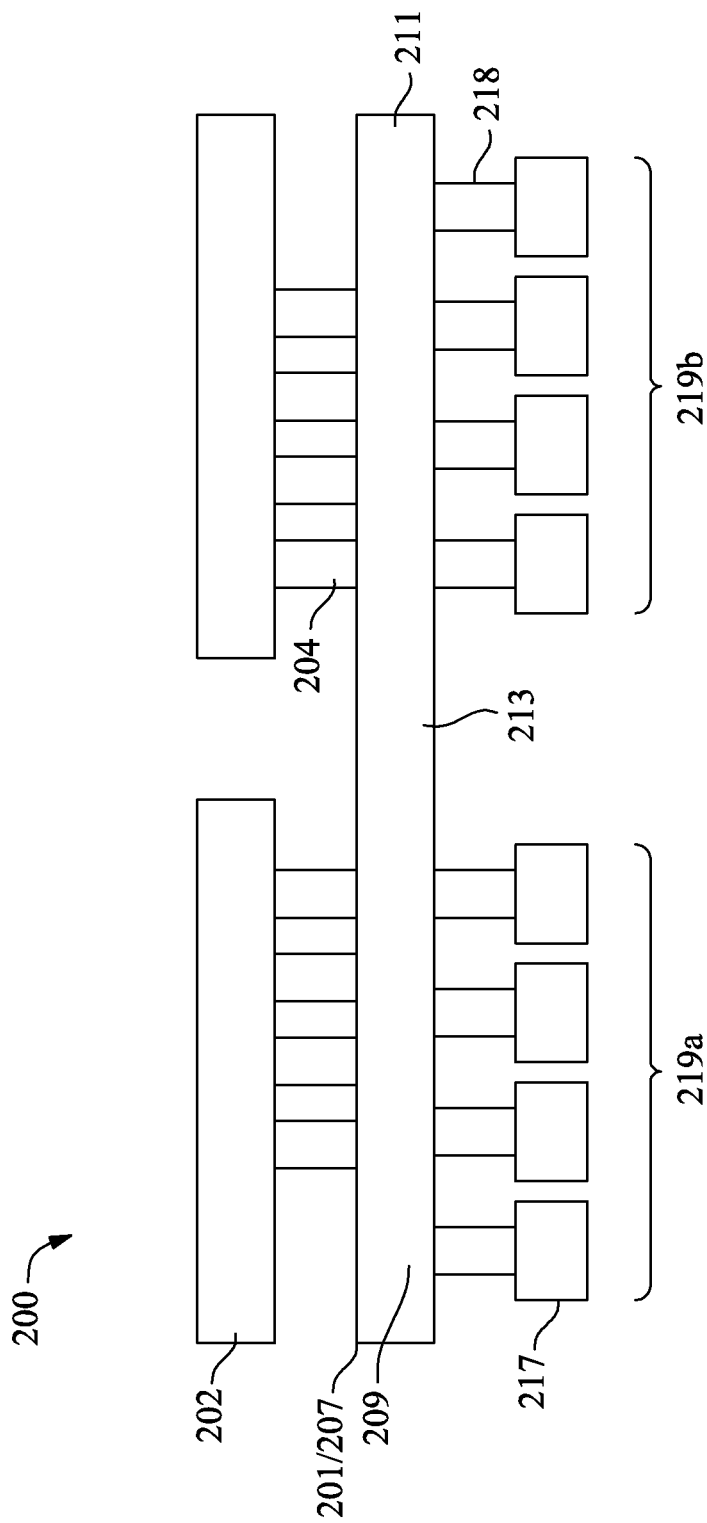
FIG. 2 is a cross-section view of a fuse structure, in accordance with some embodiments.

FIG. 2 is a cross-sectional side view of a fuse structure 200, in accordance with one or more embodiments. Fuse structure 200 includes many of the features included in fuse structure 100 (FIG. 1), with the reference numerals increased by 100. The cross-section is taken through the fuse line 107 in the Y-direction (FIG. 1). The fuse structure 200 includes a third conductive layer 202 over the substrate 203 on a third level different from the first level and the second level. The third conductive layer 202 is over the first conductive layer 201. The third conductive layer 202 is coupled with the second conductive layer 201 by couplings 204. Couplings 204 are one or more of vias, conductive lines, contact pads, or other suitable connecting structure or direct contact between the first conductive layer 201 and the third conductive layer 202. The third conductive layer 202 comprises a metal such as copper, gold, aluminum, nickel, titanium, other suitable conductive material, or combination thereof. The third conductive layer 202 is formed by one or more of a physical vapor deposition process, a chemical vapor deposition process, a plating process, or another suitable process of forming a conductive layer over a substrate. A current is supplied to the fuse line 207 to program the fuse structure 200 (i.e., to intentionally blow the fuse structure 200).

The first conductive layer 201 is over the second conductive layer 217. The first conductive layer 201 is coupled with the second conductive layer 217 by couplings 218. The second conductive layer 217 includes parallel lines 219a below the first end portion 209 of the fuse line 207 and parallel lines 219b below the second end portion 211 of the fuse line 207.

Figure 3:
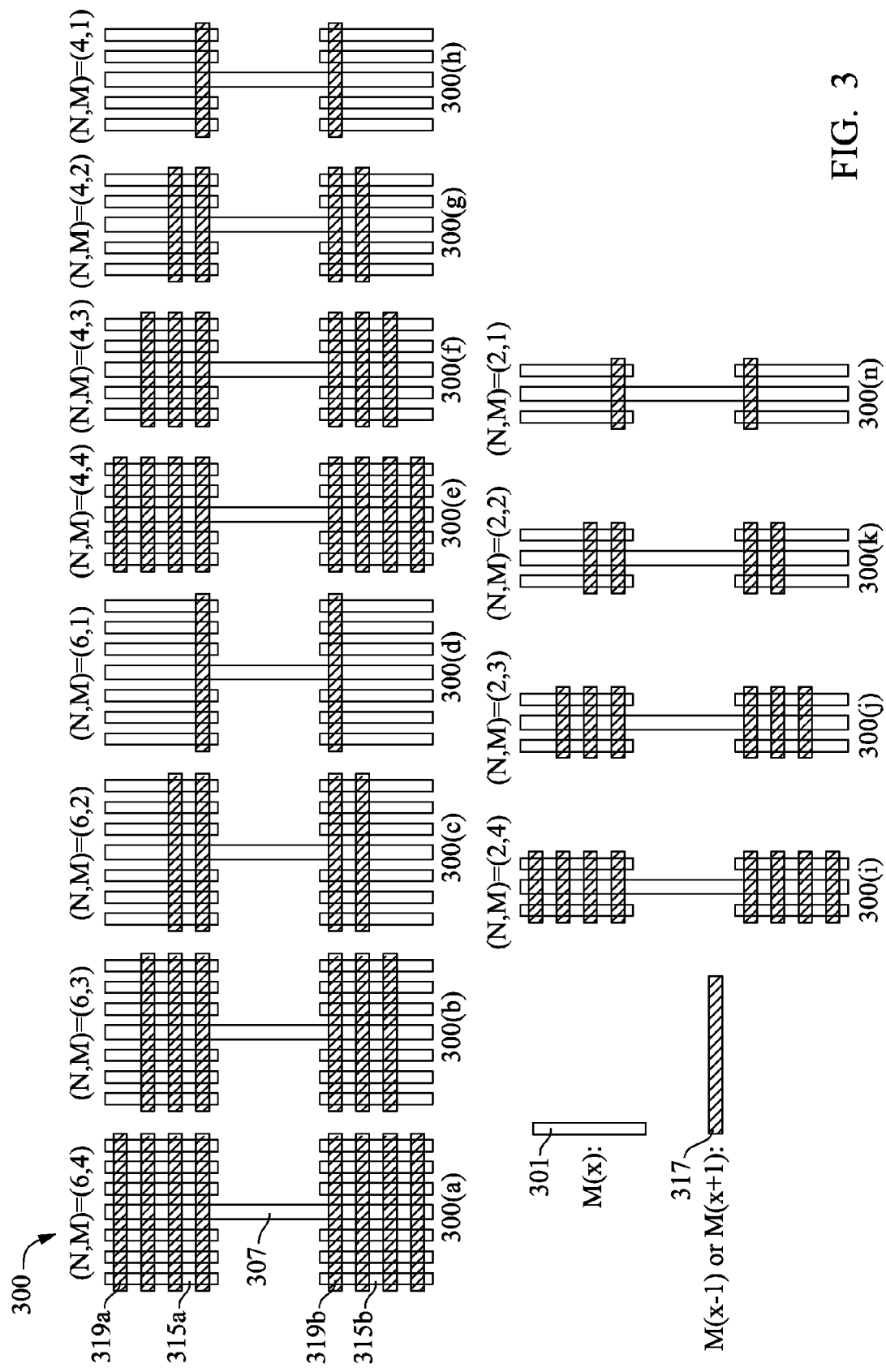
FIG. 3 is a diagram of example configurations of a first conductive layer and a second conductive layer of a fuse structure, in accordance with some embodiments.

FIG. 3 is a diagram of example configurations of first conductive layer 301 and second conductive layer 317 of a fuse structure 300, in accordance with one or more embodiments. Fuse structure 300 includes many of the features included in fuse structure 100 (FIG. 1), with the reference numerals increased by 200. In some embodiments, first conductive layer 301 is over second conductive layer 317. In other embodiments, second conductive layer 317 is over first conductive layer 301. The first conductive layer 301 is designated as M(x), where M indicates a metal layer, and (x) indicates a level of the metal layer. The second conductive layer 317 is designated as M(x−1) or M(x+1), wherein M indicates a metal layer, and (x−1) or (x+1) indicates a different level compared to M(x), wherein M(x+1) is a level over M(x) and M(x−1) is a level lower than M(x).

Configurations 300a-300n include different example combinations of lines 315a, 315b, 319a and 319b. The example configurations include N lines 315a, N lines 315b, M lines 319a and M lines 319b. The various example configurations have several positive values of N and M, and, in some embodiments, the values are independently set to be a suitable quantity capable of effectively widening the width of the fuse line 307 on the first end portion 309 of the fuse line 307 and the second end portion 311 of the fuse line 307, based on a design rule governing the manufacturability of the fuse structure 300.

Figure 4:
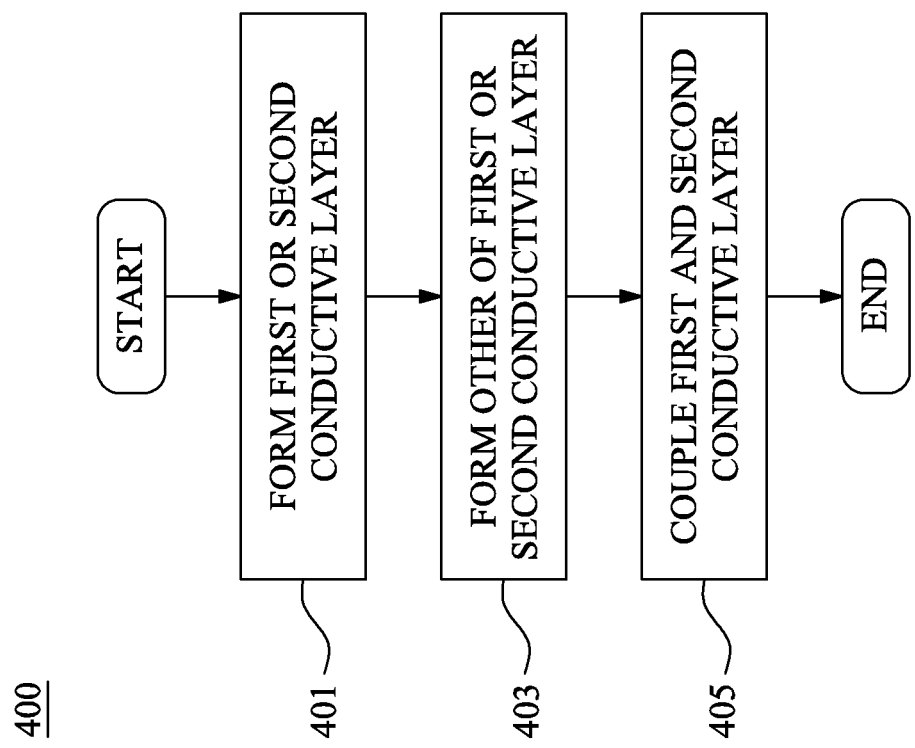
FIG. 4 is a flowchart of a method of manufacturing a fuse structure, in accordance with some embodiments.

FIG. 4 is a flowchart of a method 400 of forming a fuse structure, in accordance with one or more embodiments.

In step 401, one of a first conductive layer such as first conductive layer 101 (FIG. 1) or a second conductive layer 117 (FIG. 1) is formed over a substrate such as substrate 103 (FIG. 1) on a first level. The first conductive layer is formed having a fuse line such as fuse line 107 (FIG. 1) extending in a first direction. The fuse line has a first end portion, a second end portion opposite the first end portion, and a fuse link portion between the first end portion and the second end portion. The first conductive layer is also formed having at least two lines parallel to the fuse line. The at least two lines parallel to the fuse line are aligned in the first direction and being separated from one another by a first distance measured in the first direction. The second conductive layer is formed having at least two parallel lines extending in a second direction different from the first direction. The at least two parallel lines are separated by a second distance measured in a third direction orthogonal to the second direction.

In step 403, the other of the first conductive layer or the second conductive layer is formed on a second level different from the first level over the substrate.

In step 405, the first conductive layer is coupled with the second conductive layer. The coupling connects the fuse line with the at least two lines parallel to the fuse line. In some embodiments, coupling the first conductive layer with the second conductive layer comprises forming couplings such as couplings 118 (FIG. 1), which in some embodiments are vias, the couplings being configured to connect the first conductive layer with the second conductive layer.

An aspect of this description is related to a fuse structure comprising a first conductive layer on a first level. The first conductive layer has a fuse line extending in a first direction. The fuse line has a first end portion, a second end portion opposite the first end portion, and a fuse link portion between the first end portion and the second end portion. The first conductive layer also comprises at least two lines parallel to the fuse line, the at least two lines parallel to the fuse line being aligned in the first direction and being separated from one another by a first distance measured in the first direction. The fuse structure also has a second conductive layer on a second level different from the first level and coupled with the first conductive layer. The second conductive layer has at least two parallel lines extending in a second direction different from the first direction, the at least two parallel lines being separated by a second distance measured in a third direction orthogonal to the second direction.

Another aspect of this description relates to a fuse structure comprising a first conductive layer on a first level. The first conductive layer has a fuse line extending in a first direction. The fuse line has a first end portion, a second end portion opposite the first end portion, and a fuse link portion connecting the first end portion and the second end portion. The first conductive layer also has a first set of parallel lines next to the first end portion of the fuse line and parallel to the fuse line. The first conductive layer additionally has a second set of parallel lines next to the second end portion of the fuse line and parallel to the fuse line. The first set of parallel lines are aligned with the second set of parallel lines in the first direction and separated from the second set of parallel lines by a first distance measured in the first direction.

The fuse structure also comprises a second conductive layer on a second level different from the first level and coupled with the first conductive layer. The second conductive layer has a third set of parallel lines extending in a second direction different from the first direction. The third set of parallel lines are next to the first end portion. The second conductive layer also has a fourth set of parallel lines extending in the second direction and next to the second end portion. The third set of parallel lines are separated from the third set of parallel lines by at least a second distance measured in a third direction orthogonal to the second direction A further aspect of this description relates to method of forming a fuse structure. The method comprises forming a first conductive layer over a substrate on a first level. The first conductive layer is formed having a fuse line extending in a first direction, the fuse line having a first end portion, a second end portion opposite the first end portion, and a fuse link portion between the first end portion and the second end portion. The first conductive layer is formed also having at least two lines parallel to the fuse line, the at least two lines parallel to the fuse line being aligned in the first direction and being separated from one another by a first distance measured in the first direction. The method also comprises forming a second conductive layer on a second level different from the first level, the second conductive layer being formed having at least two parallel lines extending in a second direction different from the first direction, the at least two parallel lines being separated by a second distance measured in a third direction orthogonal to the second direction. The method further comprises coupling the first conductive layer with the second conductive layer, the coupling the connecting the fuse line with the at least two lines parallel to the fuse line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fuse structure comprising:
    a first conductive layer on a first level, the first conductive layer having:
        a fuse line extending in a first direction, the fuse line having a first end portion, a second end portion opposite the first end portion, and a fuse link portion coupling the first end portion and the second end portion; and
        at least two lines parallel to the fuse line, the at least two lines parallel to the fuse line being aligned in the first direction and being separated from one another by a first distance measured in the first direction; and
    a second conductive layer on a second level different from the first level and coupled with the first conductive layer, the second conductive layer having at least two parallel lines extending in a second direction different from the first direction, the at least two parallel lines being separated by a second distance measured in a third direction orthogonal to the second direction.

2. The fuse structure of claim 1, wherein the second direction is orthogonal to the first direction, and the third direction is the first direction.

3. The fuse structure of claim 1, wherein the first conductive layer and the second conductive layer are coupled by vias.

4. The fuse structure of claim 1, wherein the first conductive layer is over the second conductive layer.

5. The fuse structure of claim 1, wherein the second conductive layer is over the first conductive layer.

6. The fuse structure of claim 1, wherein the first distance is greater than or equal to a length of the fuse link portion.

7. The fuse structure of claim 1, wherein the second distance is greater than or equal to a length of the fuse link portion.

8. The fuse structure of claim 1, wherein the fuse line has a first width and the at least two lines parallel to the fuse line have a second width equal to the first width.

9. The fuse structure of claim 1, wherein the fuse line has a first width and the at least two lines parallel to the fuse line have a second width greater than the first width.

10. The fuse structure of claim 1, wherein the at least two lines parallel to the fuse line are a first set of parallel lines separated from a second set of parallel lines by the first distance, the first set of parallel lines are next to the first end portion and the second set of parallel lines are next to the second end portion.

11. The fuse structure of claim 1, wherein the at least two parallel lines in the second conductive layer are a first set of parallel lines extending in the second direction and a second set of parallel lines extending in the second direction, the first set of parallel lines extending in the second direction being separated from the second set of parallel lines extending in the second direction by at least the second distance.

12. The fuse structure of claim 1, further comprising:
    a third conductive layer coupled with the second conductive layer on a third level different from the first level and the second level.

13. A fuse structure comprising:
    a first conductive layer on a first level, the first conductive layer having:
        a fuse line extending in a first direction, the fuse line having a first end portion, a second end portion opposite the first end portion, and a fuse link portion coupling the first end portion and the second end portion;
        a first set of parallel lines next to the first end portion of the fuse line and parallel to the fuse line; and
        a second set of parallel lines next to the second end portion of the fuse line and parallel to the fuse line, the first set of parallel lines parallel being aligned with the second set of parallel lines in the first direction and separated from the second set of parallel lines by a first distance measured in the first direction; and
    a second conductive layer on a second level different from the first level and coupled with the first conductive layer, the second conductive layer having:
        a third set of parallel lines extending in a second direction different from the first direction, the third set of parallel lines being next to the first end portion; and
        a fourth set of parallel lines extending in the second direction and next to the second end portion, the fourth set of parallel lines being separated from the third set of parallel lines by at least a second distance measured in a third direction orthogonal to the second direction.

14. The fuse structure of claim 13, wherein the first set of parallel lines has a first quantity of lines and the second set of parallel lines has a second quantity of lines equal to the first quantity of lines.

15. The fuse structure of claim 13, wherein the third set of parallel lines has a third quantity of lines and the fourth set of parallel lines has a fourth quantity of lines equal to the third quantity of lines.

16. The fuse structure of claim 15, wherein the first quantity of lines and the second quantity of lines are equal to the third quantity of lines and the fourth quantity of lines.

17. The fuse structure of claim 15, wherein the first quantity of lines and the second quantity of lines are greater than the third quantity of lines and the fourth quantity of lines.

18. The fuse structure of claim 15, wherein the first quantity of lines and the second quantity of lines are less than the third quantity of lines and the fourth quantity of lines.

19. A fuse structure comprising:
    a first conductive layer on a first level, the first conductive layer having:
        a fuse line extending in a first direction, the fuse line having a first end portion, a second end portion opposite the first end portion, and a fuse link portion coupling the first end portion and the second end portion; and
        at least two lines parallel to the fuse line, the at least two lines parallel to the fuse line being aligned in the first direction and being separated from one another by a first distance measured in the first direction; and
    a second conductive layer on a second level different from the first level and coupled with the first conductive layer, the second conductive layer having at least two parallel lines extending in a second direction different from the first direction, the at least two parallel lines being separated by a second distance measured in a third direction different from the second direction,
    wherein a first quantity of the at least two lines parallel to the fuse line in the first layer is different from a second quantity of the at least two parallel lines in the second layer.

20. The fuse structure of claim 19, wherein the fuse line has a first width and at least one of the at least two lines parallel to the fuse line has a second width different from the first width.

* * * * *